United States Patent
Joshi et al.

(10) Patent No.: US 6,836,023 B2
(45) Date of Patent: Dec. 28, 2004

(54) STRUCTURE OF INTEGRATED TRACE OF CHIP PACKAGE

(75) Inventors: Rajeev Joshi, Cupertino, CA (US); Chung-Lin Wu, San Jose, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/413,796

(22) Filed: Apr. 14, 2003

(65) Prior Publication Data

US 2003/0197278 A1 Oct. 23, 2003

Related U.S. Application Data

(60) Provisional application No. 60/373,706, filed on Apr. 17, 2002.

(51) Int. Cl.[7] .......................... H01L 23/48; H01L 23/52
(52) U.S. Cl. .................... 257/780; 257/781; 257/784
(58) Field of Search ................. 257/781, 784, 257/736, 737, 738, 780, 779

(56) References Cited

U.S. PATENT DOCUMENTS

| | | | | |
|---|---|---|---|---|
| 5,485,033 A | * | 1/1996 | Leduc | .......................... 257/578 |
| 5,637,916 A | | 6/1997 | Joshi | |
| 5,726,500 A | * | 3/1998 | Duboz et al. | ................ 257/777 |
| 5,765,280 A | | 6/1998 | Joshi | |
| 5,789,809 A | | 8/1998 | Joshi | |
| 5,898,223 A | * | 4/1999 | Frye et al. | .................. 257/777 |
| 6,020,561 A | * | 2/2000 | Ishida et al. | ................. 174/261 |
| 6,133,634 A | | 10/2000 | Joshi | |
| 6,187,615 B1 | | 2/2001 | Kim et al. | |
| 6,287,893 B1 | * | 9/2001 | Elenius et al. | .............. 438/108 |
| 6,294,403 B1 | | 9/2001 | Joshi | |
| 6,380,555 B1 | * | 4/2002 | Hembree et al. | ............. 257/48 |
| 6,407,459 B2 | * | 6/2002 | Kwon et al. | ................. 257/780 |
| 6,469,384 B2 | | 10/2002 | Joshi | |
| 6,489,678 B1 | | 12/2002 | Joshi | |
| 6,492,200 B1 | * | 12/2002 | Park et al. | ................... 438/113 |
| 6,566,749 B1 | | 5/2003 | Joshi et al. | |
| 6,590,295 B1 | * | 7/2003 | Liao et al. | .................... 257/781 |
| 6,617,674 B2 | * | 9/2003 | Becker et al. | .............. 257/678 |
| 6,621,164 B2 | * | 9/2003 | Hwang et al. | .............. 257/738 |
| 2002/0000673 A1 | * | 1/2002 | Farnworth | ................... 257/779 |

* cited by examiner

*Primary Examiner*—Jasmine Clark
(74) *Attorney, Agent, or Firm*—Townsend and Townsend & Crew, LLP

(57) ABSTRACT

A semiconductor die package is disclosed. The die package includes a semiconductor die having a first side and a second side, a vertical transistor, and a bond pad at the first side. A passivation layer having a first aperture is on the first side, and the bond pad is exposed through the first aperture. An underbump metallurgy layer is on and in direct contact with the passivation layer. The underbump metallurgy layer is within the first aperture and contacts the bond pad. A dielectric layer comprising a second aperture is on and in direct contact with the underbump metallurgy layer. A solder structure is on the underbump metallurgy layer and is within the second aperture of the dielectric layer.

20 Claims, 2 Drawing Sheets

US 6,836,023 B2

STRUCTURE OF INTEGRATED TRACE OF CHIP PACKAGE

CROSS-REFERENCE TO RELATED APPLICATIONS

This application is a non-provisional of and claims the benefit of U.S. Provisional Patent Application No. 60/373,706, filed on Apr. 17, 2002. This U.S. Provisional Patent Application is herein incorporated by reference in its entirety.

BACKGROUND OF THE INVENTION

A semiconductor die with an integrated circuit has conductive pads formed at the periphery of the top surface of the die. Wires can be used to connect conductive pads in the semiconductor die to pads on a package substrate.

As the complexity of electronic circuitry increases, the conductive pads (that form inputs and outputs) in the semiconductor die are formed more closely together, thereby reducing the pad pitch. The lengths of wires are longer and the widths are narrower when the pad pitch is reduced. Increasing the lengths of the bonding wires increases the inductances in the wires, which reduces the speed of the circuitry.

Instead of wires, solder joints can be used to directly connect the pads in a semiconductor die to a circuit substrate, thereby providing shorter connection distances between the semiconductor die and the substrate. Solder joints form more stable joints than wire bonds. The switch from integrated circuit packages that are molded to chip scale packages or flip chip packages is a trend in the semiconductor industry.

However, the unmatched CTE (coefficient thermal expansion) between silicon in a semiconductor die and the mounting board (to which the die is mounted) requires larger and higher solder balls to fulfill solder joint reliability requirements. Unfortunately, this is contrary to another trend in the industry, which is to form thin, small and low profile packages for mobile electronic devices.

The bump pitch associated with an integrated circuit in a semiconductor die is much smaller than the pitch of conductive regions on a mounting board. Some have used redistribution traces comprising an underbump metallurgy to relocate the bond pads on integrated circuits to match the spacings of the conductive regions (e.g., conductive pads) on a mounting board.

Some have described the use of two dielectric layers including polyimide and BCB (benzcyclobutane) to fulfill the above design requirement. However, having two dielectric layers on a semiconductor die can cause many process and stress problems. First, the aluminum bond-pad in the die, the UBM of the redistributing trace, and two dielectric layers form a complicated structure that is difficult to manufacture. Second, the unmatched CTE of each material induces thermal stress in the integrated circuits below the dielectric layers, thereby damaging the integrated circuits when the dielectric layers are cured at high temperatures. Two layers of dielectric material will cause more thermal stress than one layer. Third, when coating and curing the second dielectric over the first cured dielectric layer, the interface bonding strength is lower than bonding two uncured dielectric layers. Fourth, there is also a cleaning process before coating the second dielectric layer. The interface strength will be influenced if the cleaning process is not complete.

In addition, the above-described processes are used for a semiconductor die that has inputs and outputs at the front side of the die. A protective back coating comprising an epoxy coating or other dielectric material is on the backside of the die. Because the backside of the semiconductor die is coated with a dielectric coating, the described processes are not suitable for die packages that include vertical MOSFET devices. In a vertical MOSFET, current passes from an input (e.g., a source region) at one side of the die to an output (e.g., a drain region) at the other side the die.

Embodiments of the invention address these and other problems.

SUMMARY OF THE INVENTION

Embodiments of the invention are directed to chip scale semiconductor die packages and methods for making chip scale semiconductor die packages.

One embodiment of the invention is directed to a semiconductor die package comprising: (a) a semiconductor die comprising a first side and a second side, a vertical transistor, and a bond pad at the first side; (b) a passivation layer having a first aperture on the first side, where the bond pad is exposed through the first aperture; (c) an underbump metallurgy layer on and in direct contact with the passivation layer, wherein the underbump metallurgy layer is at least partially within the first aperture and contacts the bond pad; (d) a single dielectric layer comprising a second aperture on and in direct contact with the underbump metallurgy layer; and (e) a solder structure on the underbump metallurgy layer, the solder structure being within the second aperture of the single dielectric layer.

Another embodiment of the invention is directed to a method of processing a semiconductor die, the method comprising: (a) providing a semiconductor die comprising a first side and a second side, a vertical transistor, and a bond pad at the first side; (b) forming a passivation layer having a first aperture on the first side, where the bond pad is exposed through the first aperture; (c) forming an underbump metallurgy layer on and in direct contact with the passivation layer, wherein the underbump metallurgy layer is at least partially within the first aperture and contacts the bond pad; (d) forming a single dielectric layer over the underbump metallurgy layer, wherein the single dielectric layer comprises a second aperture on and in direct contact with the underbump metallurgy layer; and (e) forming a solder structure on the underbump metallurgy layer and within the second aperture of the dielectric layer.

Another embodiment of the invention is directed to an electrical assembly comprising: (a) a circuit substrate including a plurality of conductive regions; and (b) a semiconductor die package comprising (i) a semiconductor die comprising a first side and a second side, a vertical transistor, and a bond pad at the first side, (ii) a passivation layer having a first aperture on the first side, where the bond pad is exposed through the first aperture, (iii) an underbump metallurgy layer on and in direct contact with the passivation layer, wherein the underbump metallurgy layer is at least partially within the first aperture and contacts the bond pad, (iv) a single dielectric layer comprising a second aperture on and in direct contact with the underbump metallurgy layer, and (v) a solder structure on the underbump metallurgy layer, the solder structure being within the second aperture of the single dielectric layer, wherein the solder structure is coupled to a conductive region within the plurality of conductive regions.

These and other embodiments are described below.

Figure 1A:
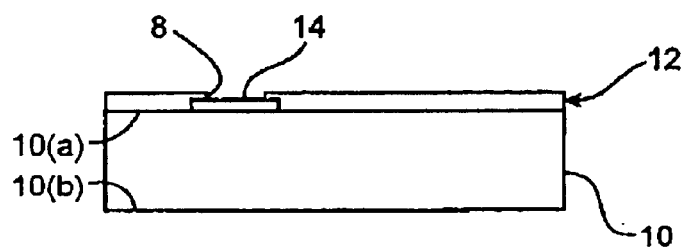
FIGS. 1(a)-1(d) show cross sections of a semiconductor die as it is being processed according to a method according to an embodiment of the invention.
Figure 1B:
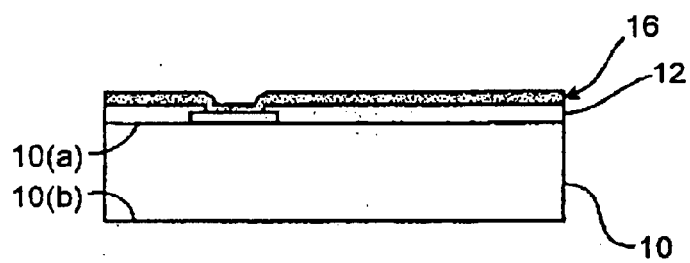
Figure 1C:
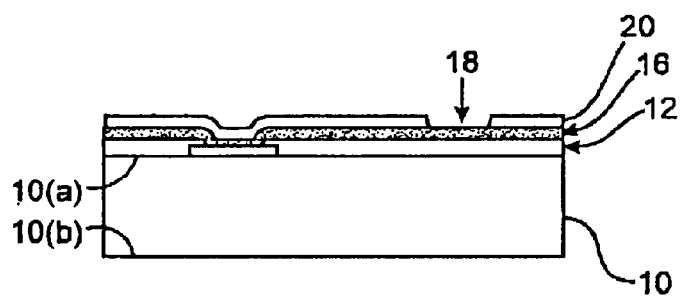
Figure 1D:
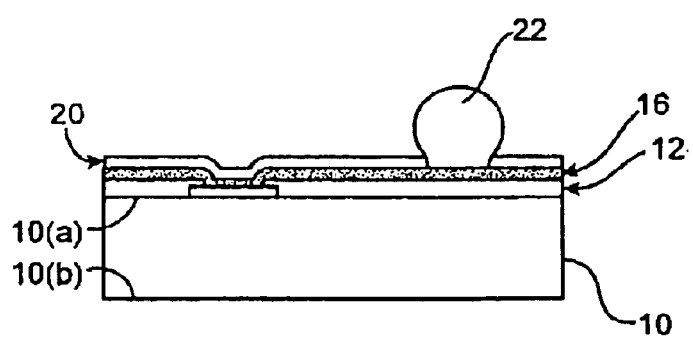

Features in the figures may not be to scale for purposes of clarity of illustration.

DETAILED DESCRIPTION

A semiconductor die package is disclosed. The die package includes a semiconductor die having a first side and a second side, a vertical transistor, and a bond pad at the first side. A passivation layer having a first aperture is on the first side, and the bond pad is exposed through the first aperture. An underbump metallurgy layer is on and in direct contact with the passivation layer. The underbump metallurgy layer is at least partially within the first aperture and contacts the bond pad. A single dielectric layer comprising a second aperture is on and in direct contact with the underbump metallurgy layer. A solder structure is on the underbump metallurgy layer and is within the second aperture of the dielectric layer.

In some embodiments, the semiconductor die package that is formed is preferably a "chip scale package". A chip scale package has nearly the same width and height as the chip which it encloses.

Embodiments of the invention use a single dielectric layer on a redistributed trace or a direct bump connection. The redistributed trace or direct bump connection comprises an underbump metallurgy and is connected to a large bond pad in a semiconductor die. The bond pad could correspond to the gate or source region of a MOSFET in the semiconductor die.

The redistribution traces may comprise an underbump metallurgy layer. An underbump metallurgy layer comprises additional metal layers that are formed on a semiconductor die prior to solder deposition or bumping. A typical underbump metallurgy layer comprises an adhesion sublayer, and a wettable/protective sublayer. For example, an exemplary underbump metallurgy layer comprises a first barrier layer comprising, for example, a refractory metal sublayer comprising Ti or Ti/W (or other refractory metal or alloy thereof), a conductive sublayer comprising Cu or Ni (or other conductive material or alloy thereof), and a third wetting/protective sublayer layer comprising Ni or Au (or other noble metal or alloy thereof). The underbump metallurgy layer may have been patterned (e.g., with lines, pads, etc.) by depositing and lithographically patterning a photoresist layer over a blanket underbump metallurgy layer. The underbump metallurgy layer may then be etched to form lines and a metallic pad for a solder bump. After etching, the photoresist layer can be removed.

The redistribution trace is protected with a single dielectric layer comprising a material such as polyimide, benzocyclobutane, nitride or oxide. The single dielectric layer has one or more apertures, and may be formed on the semiconductor die before solder is deposited on the underbump metallurgy layer. The trace comprising an underbump metallurgy layer is exposed through one or more apertures in the single dielectric layer.

Using one dielectric layer over a redistribution trace simplifies the processing steps used to form a semiconductor die package and lowers the cost of the formed package, relative to packages that use two or more dielectric layers over the redistribution trace. For example, one dielectric layer needs only one high temperature curing step. Performing one high temperature curing step lowers the thermal stress on the package, thereby increasing the reliability of the die package. In embodiments of the invention, the dielectric layer may comprise a polymeric or an inorganic material (e.g., a ceramic or a ceramic-like material). For those embodiments that use an inorganic material such as silicon nitride or silicon oxide (e.g., silicon dioxide) as a dielectric layer, the integrated trace structure on a semiconductor die has a lower thermal stress than the packages that use two or more polymeric dielectric layers on the semiconductor die. In such embodiments, the CTE (coefficient of thermal expansion) of the silicon die is closer to the CTE of silcon nitride or a silicon oxide, than a polymeric material such as BCB.

Solder can be deposited on the exposed regions of the underbump metallurgy layer and within the one or more apertures. The solder is deposited by a process such as electroplating or by direct ball placement. The solder may comprise Pb—Sn solder (63Sn/37Pb).

The transistors in the semiconductor dies in the semiconductor die packages according to embodiments of the invention can include vertical power transistors. Vertical power transistors include vertical MOS transistors such as a VDMOS (vertical diffused metal oxide semiconductor) and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. In other embodiments, the transistors in the semiconductor dies can be bipolar transistors. In such embodiments, one side of the semiconductor die can have an emitter region and a base region. The other side of the die can have a collector region.

Vertical power transistor devices have advantages over LDMOS (lateral diffused metal oxide semiconductor) devices, which have source regions and drain regions at the same side of a semiconductor die. For example, the cells in a VDMOS are smaller and more dense than the cells in an LDMOS device, since the source region and the drain region in a VDMOS device are at opposite sides of the semiconductor die. Consequently, a VDMOS device can have a lower "on" resistance than an LDMOS device.

FIGS. 1(a)-1(d) show how a semiconductor die package according to an embodiment of the invention can be formed.

Referring to FIG. 1(a), a semiconductor die 10 with a first side 10(a) and a second side 10(b) is provided with a bond pad 14 at the first side 10(a). The bond pad 14 may comprise aluminum or an aluminum alloy. The bond pad 14 may have a thickness on the order of about 80 to about 100 microns. Only one bond pad 14 is shown for simplicity of illustration. It is understood that there may be many such bond pads in a semiconductor die. Also for simplicity of illustration, only one die is shown in FIG. 1(a). The single die may be one or many dies in a semiconductor wafer in some embodiments.

A passivation layer 12 is on the first side 10(*a*) of the semiconductor die 10. The passivation layer 12 may comprise a dielectric material such as silicon oxide or silicon nitride. As shown in FIG. 1(*a*), the passivation layer 12 includes a first aperture 8 which exposes a portion of the bond pad 14. The passivation layer 12 may have a thickness on the order of about 70 to about 90 microns.

The semiconductor die 10 comprises a vertical transistor, and may have any of the characteristics described above. If the vertical transistor is a vertical power MOSFET, a source region and gate region may be at the first side 10(*a*), while a drain region is at the second side 10(*b*). For example, the bond pad 14 could serve as a connection to a source region in the semiconductor die 10. In a vertical power MOSFET, current flows from the source region at the first side 10(*a*) to the drain region at the second side 10(*b*).

As shown in FIG. 11(*b*), an underbump metallurgy layer 16 is formed on the semiconductor die 10. The underbump metallurgy layer 16 may comprise two or more sublayers. In one embodiment, the underbump metallurgy layer 16 may comprise a refractory metal sublayer comprising Ti or Ti/W (or other refractory metal or alloy thereof), a conductive sublayer comprising Cu or Ni (or other conductive material or alloy thereof), and a third wetting/protective sublayer layer comprising Ni or Au (or other noble metal or alloy thereof). The underbump metallurgy layer 16 may have a total thickness on the order of about 325 microns (or more).

The underbump metallurgy layer may be deposited and then patterned in any suitable manner. For example, the sublayers making up the underbump metallurgy layer 16 may be deposited as blanket sublayers using sputtering, evaporation, vapor deposition, electroplating, etc. These blanket sublayers may then be patterned using conventional photolithography processes. For example, a photoresist pattern may be formed on the blanket sublayers and they may be etched using a dry or wet etching process. The photoresist pattern may thereafter be removed.

Referring to FIG. 1(*c*), a single dielectric layer 20 is then formed over the patterned underbump metallurgy layer 16. As shown in FIG. 1(*c*), no additional dielectric layers are formed over the underbump metallurgy layer 16. The single dielectric layer 20 may comprise a polymeric material such as polyimide or BCB (benzcyclobutane), or an inorganic, ceramic or ceramic-like material such as a nitride or an oxide. A second aperture 18 is in the single dielectric layer 20 and exposes a portion of the underbump metallurgy layer 16. As shown in FIG. 1(*c*), in this embodiment, the second aperture 18 and the first aperture 8 are not aligned. The underbump metallurgy layer 16 may include a conductive trace, which effectively redistributes the connection to the bond pad 14.

If the single dielectric layer 20 includes a material such as polyimide or BCB, a blanket polymeric layer may be deposited on the semiconductor die 10 using a process such as spray coating, spin coating, or chemical vapor deposition. Then, the deposited polymeric layer may be cured and patterned using conventional photolithography processes. If the single dielectric layer 20 includes an inorganic material such as silicon nitride or silicon oxide, a blanket layer of nitride or oxide (e.g., using a chemical vapor deposition process) can be deposited on the semiconductor die 10 and can be patterned using conventional photolithography and etching processes. As noted above, a single, inorganic dielectric layer such as silicon oxide or silicon nitride is desirable, since it has a CTE close to the CTE of the semiconductor die.

Referring to FIG. 1(*d*), after forming the single dielectric layer 20 on the semiconductor die, a solder structure 22 (e.g., a solder bump, a solder column, etc.) is formed in the second aperture 18. As shown, the solder structure 22 is electrically coupled to the bond pad 14 through the underbump metallurgy layer 16. The solder structure 22 may comprise Pb—Sn solder. The solder structure 22 can be reflowed according to conventional processes, and then flipped over and then mounted to a circuit substrate (not shown) to form an electrical assembly.

Figure 2:
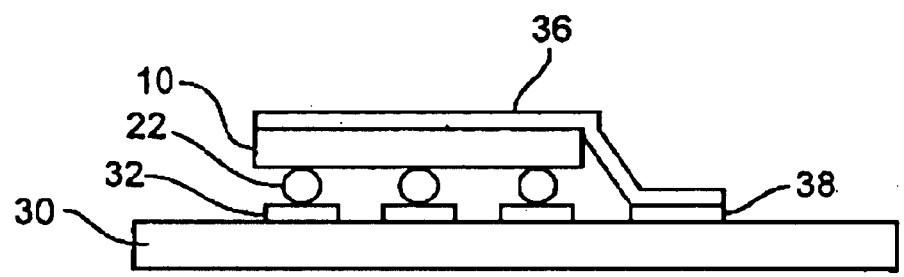
FIG. 2 shows a cross-section of a semiconductor die mounted on a circuit substrate with a drain clip attached to it.

FIG. 2 shows the semiconductor die 10 after it has been flipped over and mounted to a circuit substrate 30. For ease of illustration, the single dielectric layer, the passivation layer, and the underbump metallurgy layer are omitted in FIG. 2. The circuit substrate 30 may be, for example, a printed circuit board, a carrier, etc. The circuit substrate 30 may have one or more dielectric and one or more conductive layers. The circuit substrate 30 has a plurality of conductive regions 32 which may correspond to a gate and source connections, and a conductive region 38 which may serve as a drain connection.

A drain clip 36 couples the backside of the semiconductor die 10 to the conductive region 38 to form an electrical assembly. The drain clip 36 may be coupled to backside the semiconductor die 10 and the conductive region 38 using, for example, solder paste (e.g., Pb—Sn solder). The drain clip 36 may comprise a material such as copper.

Figure 3:
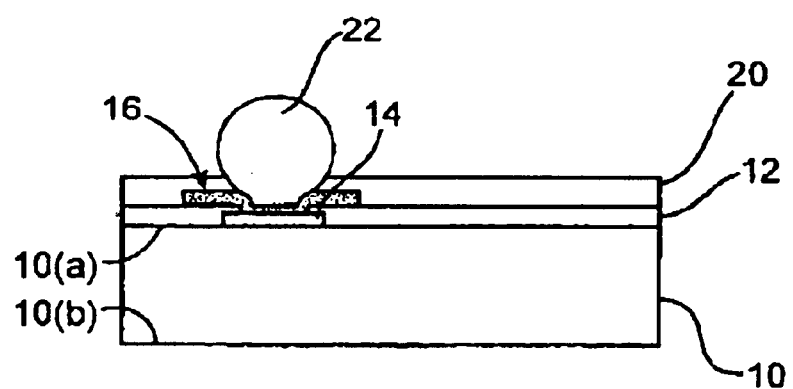
FIG. 3 shows a cross-section of another embodiment of the invention where an aperture in a dielectric layer and an aperture in a passivation layer are aligned.

FIG. 3 shows another embodiment of the invention. In FIG. 3, like numerals designate like elements as in FIGS. 1(*a*)-1(*d*). FIG. 3 shows an embodiment of the invention where the first aperture in the passivation layer 12 and the second aperture in the single dielectric layer 20 are aligned. The underbump metallurgy layer 16 and the solder structure 22 are directly over the bond pad 14. As in the prior embodiment, there is only one dielectric layer 20 on the semiconductor die 10. The single dielectric layer 20 and the passivation layer 12 are in direct contact with the underbump metallurgy layer 16. The single dielectric layer 20 may have any of the features described above, and protects the underbump metallurgy layer 16. The illustrated bumped die shown in FIG. 3 can be flipped over and mounted to a circuit substrate as shown in FIG. 2 to form an electrical assembly.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A semiconductor die package comprising:
   (a) a semiconductor die comprising a first side and a second side, a vertical transistor, and a bond pad at the first side;
   (b) a passivation layer having a first aperture on the first side, where the bond pad is exposed through the first aperture;
   (c) an underbump metallurgy layer on and in direct contact with the passivation layer, wherein the underbump metallurgy layer is at least partially within the first aperture and contacts the bond pad;
   (d) a single dielectric layer comprising a second aperture on and in direct contact with the underbump metallurgy layer; and (e) a solder structure on the widerbump metallurgy layer, the solder structure being within the second aperture of the single dielectric layers, wherein the vertical transistor comprises a power MOSFET comprising a gate region, a source region, and a drain region, wherein the gate region and the source region are at the first side of the semiconductor die, and the drain region is at the second side of the semiconductor die.

2. The semiconductor die package of claim 1 wherein the first aperture in the passivation layer and the second aperture in the single dielectric layer are not aligned.

3. A semiconductor die package comprising:
(a) a semiconductor die comprising a first side and a second side, a vertical transistor, and a bond pad at the first side;
(b) a passivation layer having a first aperture on the first side, where the bond pad is exposed through the first aperture;
(c) an underbump metallurgy layer on and in direct contact with the passivation layer, wherein the underbump metallurgy layer is at least partially within the first aperture and contacts the bond pad;
(d) a single dielectric layer comprising a second aperture on and in direct contact with the underbump metallurgy layer; and
(e) a solder structure on the underbump metallurgy layer, the solder structure being within the second aperture of the single dielectric layer, wherein the first aperture in the passivation layer and the second aperture in the dielectric layer are aligned.

4. The semiconductor die package of claim 1 wherein the gate region comprises a trenched gate.

5. The semiconductor die package of claim 1 wherein the underbump metallurgy layer comprises two or more sublayers of metal.

6. A semiconductor die package comprising:
(a) a semiconductor die comprising a first side and a second side, a vertical transistor, and a bond pad at the first side;
(b) a passivation layer having a first aperture on the first side, where the bond pad is exposed through the first aperture;
(c) an underbump metallurgy layer on and in direct contact with the passivation layer, wherein the underbump metallurgy layer is at least partially within the first aperture and contacts the bond pad;
(d) a single dielectric layer comprising a second aperture on and in direct contact with the underbump metallurgy layer; and
(e) a solder structure on the underbump metallurgy layer, the solder structure being within the second aperture of the single dielectric layer,
wherein the underbump metallurgy layer comprises a first sublayer, a second sublayer, and a third sublayer, wherein the first sublayer comprises Au or Ni, the second sublayer comprises Cu or Ni, and the third sublayer comprises Ti or TiW.

7. The semiconductor die package of claim 1 wherein the single dielectric layer comprises at least one selected from the group consisting of polyimide, benzcyclobutane, a nitride, and an oxide.

8. A method comprising:
(a) providing a semiconductor die comprising a first side and a second side, a vertical transistor, and a bond pad at the first side;
(b) forming a passivation layer having a first aperture on the first side, where the bond pad is exposed through the first aperture;
(c) forming an underbump metallurgy layer on and in direct contact with the passivation layer, wherein the underbump metallurgy layer is at least partially within the first aperture and contacts the bond pad;
(d) forming a single dielectric layer over the underbump metallurgy layer, wherein the single dielectric layer comprises a second aperture on and in direct contact with the underbump metallurgy layer; and
(e) forming a solder structure on the underbump metallurgy layer and within the second aperture of the dielectric layer,
wherein the vertical transistor comprises a power MOSFET comprising a gate region, a source region, and a drain region, wherein the gate region and the source region are at the first side of the semiconductor die, and the drain region is at the second side of the semiconductor die.

9. The method of claim 8 wherein the first aperture in the passivation layer and the second aperture in the dielectric layer are not aligned.

10. A method comprising:
(a) providing a semiconductor die comprising a first side and a second side, a vertical transistor, and a bond pad at the first side;
(b) forming a passivation layer having a first aperture on the first side, where the bond pad is exposed through the first aperture;
(c) forming an underbump metallurgy layer on and in direct contact with the passivation layer, wherein the underbump metallurgy layer is at least partially within the first aperture and contacts the bond pad;
(d) forming a single dielectric layer over the underbump metallurgy layer, wherein the single dielectric layer comprises a second aperture on and in direct contact with the underbump metallurgy layer; and
(e) forming a solder structure on the underbump metallurgy layer and within the second aperture of the dielectric layer,
wherein the first aperture in the passivation layer and the second aperture in the dielectric layer are aligned.

11. The method of claim 8 wherein the gate region comprises a trenched gate.

12. The method of claim 8 wherein the underbump metallurgy layer comprises two or more sublayer of metal.

13. A method comprising:
(a) providing a semiconductor die comprising a first side and a second side, a vertical transistor, and a bond pad at the first side;
(b) forming a passivation layer having a first aperture on the first side, where the bond pad is exposed through the first aperture;
(c) forming an underbump metallurgy layer on and in direct contact with the passivation layer, wherein the underbump metallurgy layer is at least partially within the first aperture and contacts the bond pad;
(d) forming a single dielectric layer over the underbump metallurgy layer, wherein the single dielectric layer comprises a second aperture on and in direct contact with the underbump metallurgy layer; and
(e) forming a solder structure on the underbump metallurgy layer and within the second aperture of the dielectric layer, wherein the underbump metallurgy layer comprises a first sublayer, a second sublayer, and a third sublayer, wherein the first sublayer comprises Au or Ni, the second sublayer comprises Cu or Ni, and the third sublayer comprises Ti or TiW.

14. The method of claim 8 wherein the dielectric layer comprises at least one selected from the group consisting of polyimide, benzcyclobutane, a nitride and an oxide.

15. An electrical assembly comprising:
   (a) a circuit substrate including a plurality of conductive regions; and
   (b) a semiconductor die package comprising (i) a semiconductor die comprising a first side and a second side, a vertical transistor, and a bond pad at the first side, (ii) a passivation layer having a first aperture on the first side, where the bond pad is exposed through the first aperture, (iii) an underbump metallurgy layer on and in direct contact with the passivation layer, wherein the underbump metallurgy layer is at least partially within the first aperture and contacts the bond pad, (iv) a single dielectric layer comprising a second aperture on and in direct contact with the underbump metallurgy layer, and (v) a solder structure on the underbump metallurgy layer, the solder structure being within the second aperture of the single dielectric layer,
   wherein the solder structure is coupled to a conductive region within the plurality of conductive regions.

16. The electrical assembly of claim 15 wherein the conductive region is a first conductive region, and wherein the electrical assembly further comprises a drain clip coupled to the second side of the semiconductor die and a second conductive region within the plurality of conductive regions.

17. The electrical assembly of claim 15 wherein the single dielectric layer comprises an inorganic material.

18. The electrical assembly of claim 15 wherein the first and second apertures are not aligned.

19. The semiconductor die package of claim 1 wherein the underbump metallurgy layer comprises a first sublayer, a second sublayer, and a third sublayer, wherein the first sub layer comprises Au or Ni, the second sublayer comprises Cu or Ni, and the third sublayer comprises Ti or TiW.

20. The method of claim 8 wherein the underbump metallurgy layer comprises a first sublayer, a second sublayer, and a third sublayer, wherein the first sublayer comprises Au or Ni, the second sublayer comprises Cu or Ni, and the third sublayer comprises Ti or TiW.

* * * * *

UNITED STATES PATENT AND TRADEMARK OFFICE
CERTIFICATE OF CORRECTION

PATENT NO. : 6,836,023 B2
DATED : December 28, 2004
INVENTOR(S) : Joshi et al.

It is certified that error appears in the above-identified patent and that said Letters Patent is hereby corrected as shown below:

Column 7,
Line 3, kindly delete "layers", and insert -- layer --

Column 8,
Line 49, kindly delete "sublayer", and insert -- sublayers --

Signed and Sealed this

Twelfth Day of April, 2005

JON W. DUDAS
*Director of the United States Patent and Trademark Office*